United States Patent
Zhang et al.

(10) Patent No.: US 9,660,127 B2
(45) Date of Patent: *May 23, 2017

(54) SPUTTERING TARGET AND METHOD FOR PRODUCING SAME

(75) Inventors: Shoubin Zhang, Sanda (JP); Masahiro Shoji, Sandi (JP)

(73) Assignees: MITSUBISHI MATERIALS CORPORATION, Tokyo (JP); SOLAR FRONTIER K.K., Tokyo (JP)

( * ) Notice: Subject to any disclaimer, the term of this patent is extended or adjusted under 35 U.S.C. 154(b) by 632 days.

This patent is subject to a terminal disclaimer.

(21) Appl. No.: 14/111,520

(22) PCT Filed: Apr. 24, 2012

(86) PCT No.: PCT/JP2012/061516
§ 371 (c)(1),
(2), (4) Date: Oct. 11, 2013

(87) PCT Pub. No.: WO2012/147985
PCT Pub. Date: Nov. 1, 2012

(65) Prior Publication Data
US 2014/0034491 A1 Feb. 6, 2014

(30) Foreign Application Priority Data

Apr. 29, 2011 (JP) ................. 2011-102587

(51) Int. Cl.
*C22C 9/00* (2006.01)
*C22F 1/08* (2006.01)
(Continued)

(52) U.S. Cl.
CPC ............... *H01L 31/18* (2013.01); *B22F 3/15* (2013.01); *C22C 1/0425* (2013.01); *C22C 9/00* (2013.01);
(Continued)

(58) Field of Classification Search
CPC ............ C23C 14/3407; C23C 14/3414; C22C 9/00–9/10; C22C 1/0425; C22F 1/08
(Continued)

(56) References Cited

U.S. PATENT DOCUMENTS 8,795,489 B2 *  8/2014  Zhang ................. C22C 1/0425
                                                  204/298.13
8,968,491 B2 *  3/2015  Zhang ..................... C22C 1/10
                                                      148/432
(Continued)

FOREIGN PATENT DOCUMENTS

JP        09-279334 A     10/1997
JP       2006-045587 A     2/2006
(Continued)

OTHER PUBLICATIONS

Office Action mailed Aug. 28, 2015 for the related Japanese Application No. 2012-204176.
(Continued)

*Primary Examiner* — Jessee Roe
*Assistant Examiner* — Anthony Liang
(74) *Attorney, Agent, or Firm* — Leason Ellis LLP

(57) ABSTRACT

Provided are a sputtering target that is capable of forming a Cu—Ga film, which has an added Ga concentration of 1 to 40 at % and into which Na is well added, by a sputtering method and a method for producing the sputtering target. The sputtering target has a component composition that contains 1 to 40 at % of Ga, 0.05 to 2 at % of Na as metal element components other than F, S and Se, and the balance composed of Cu and unavoidable impurities. The sputtering target contains Na in at least one form selected from among sodium fluoride, sodium sulfide, and sodium selenide, and has a content of oxygen of from 100 to 1,000 ppm.

9 Claims, 1 Drawing Sheet

(51) Int. Cl.
   *H01L 31/18*   (2006.01)
   *H01L 31/032*   (2006.01)
   *C23C 14/34*   (2006.01)
   *C22C 1/04*   (2006.01)
   *B22F 3/15*   (2006.01)

(52) U.S. Cl.
   CPC ...... *C23C 14/3414* (2013.01); *H01L 31/0322* (2013.01); *B22F 2999/00* (2013.01); *Y02E 10/541* (2013.01); *Y02P 70/521* (2015.11)

(58) Field of Classification Search
   USPC ....... 204/298.13; 420/469–500; 75/245–247; 148/432; 106/1.05–1.29
   See application file for complete search history.

(56) References Cited

U.S. PATENT DOCUMENTS

2012/0045360 A1*  2/2012  Matsumura ........... C22C 1/0425
                                                     420/591
2012/0217157 A1*  8/2012  Zhang ................... C22C 1/0425
                                                     204/298.13

FOREIGN PATENT DOCUMENTS

| JP | 2007-266626 | A | 10/2007 |
| JP | 2009-102707 | A | 5/2009 |
| JP | 2009283560 | A | 12/2009 |
| JP | 2010265544 | A | 11/2010 |
| JP | 2011-084804 | A | 4/2011 |
| WO | WO-2011010529 | A1 | 1/2011 |
| WO | WO-2011055537 | A1 | 5/2011 |
| WO | WO-2011083647 | A1 | 7/2011 |
| WO | WO-2011114657 | A1 | 9/2011 |

OTHER PUBLICATIONS

Toru Tanaka et al., Characterization of Cu(InxGA1-C)2 Se3.5 Thin Films Prepared by rf Sputtering; Solar Energy Materials and Solar Cells, 1998, vol. 50, pp. 13-18.
Tooru Tanaka et al., Preparation of Cu(In,Ga)2Se3.5 Thin Films by Radio Frequency Sputtering from Stoichiometric Cu(In,Ga)Se2 and Na2Se mixture target, J. Appl.Phys., vol. 81, pp. 7619-7622.
International Search Report for PCT/JP2012/061516.

* cited by examiner

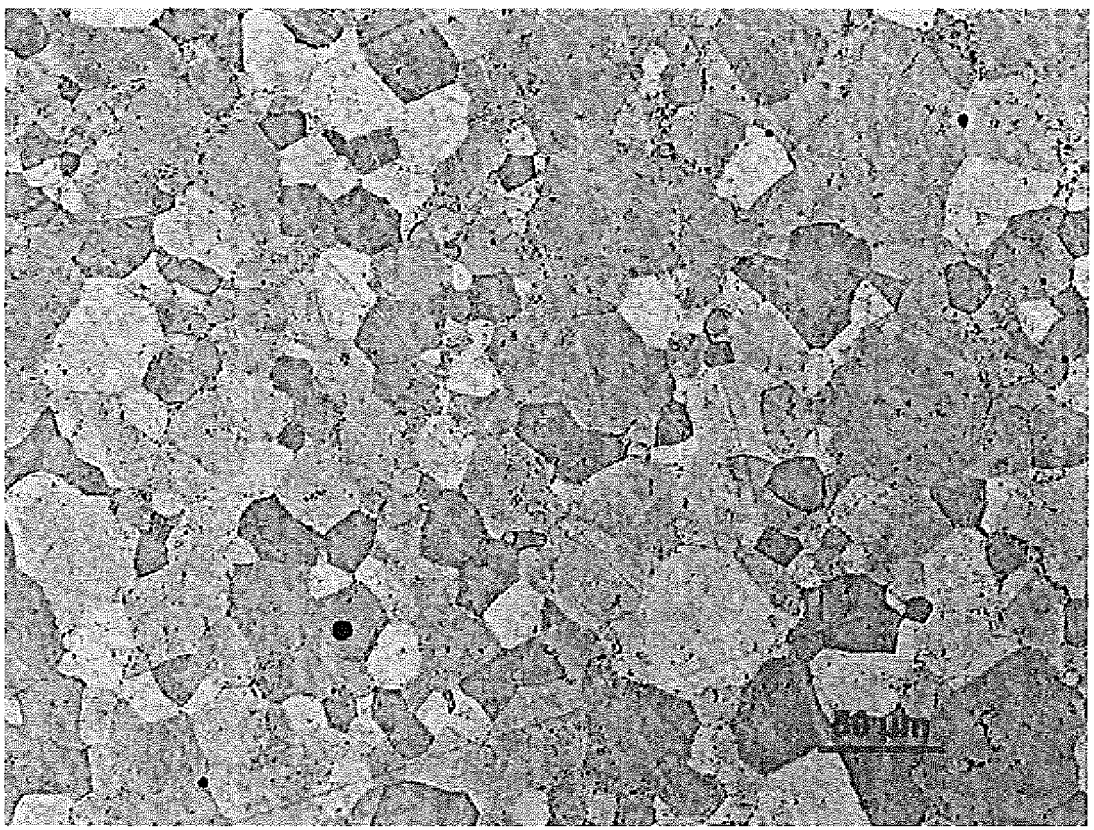

SPUTTERING TARGET AND METHOD FOR PRODUCING SAME

CROSS-REFERENCE TO RELATED APPLICATIONS

This application is a U.S. National stage application of PCT International Application No. PCT/JP2012/061516 filed Apr. 24, 2012, which claims the benefit of Japanese Patent Application No. 2011-102587 filed Apr. 29, 2011, the entire contents of the aforementioned applications are hereby incorporated herein by reference.

BACKGROUND OF THE INVENTION

Field of the Invention

The present invention relates to a sputtering target for use in forming a Cu—In—Ga—Se compound film (hereinafter referred to as "CIGS film") for forming a light absorbing layer of a CIGS thin-film solar cell, and a method for producing the same.

Description of the Related Art

In recent years, thin film solar cells made by using a chalcopyrite compound semiconductor have been practically employed. The thin-film solar cell made by using the compound semiconductor has a basic structure in which an Mo electrode layer serving as a positive electrode is formed on a sodalime glass substrate, a light absorbing layer consisting of a CIGS film is formed on the Mo electrode layer, a buffer layer consisting of ZnS, CdS, and the like is formed on the light absorbing layer, and a transparent electrode layer serving as a negative electrode is formed on the buffer layer.

As a method for forming the light absorbing layer described above, a vapor deposition film-forming method is known. Although a light absorbing layer obtained by the method, may exhibit high energy conversion efficiency, the vapor deposition film-forming method attains slow speed for forming a film. Hence, when a film is formed on a substrate having a large area, the uniformity of the in-plane distribution of the film thickness is readily reduced. Thus, a sputtering method for forming a light absorbing layer has been proposed.

As a sputtering method for forming the light absorbing layer, a method has been proposed in which an In film is firstly formed by sputtering using an In target, a Cu—Ga binary alloy film is formed on the In film by sputtering using a Cu—Ga binary alloy target, and a stacked precursor film consisting of the obtained In film and the Cu—Ga binary alloy film is subject to heat treatment in a Selenium atmosphere to thereby form a CIGS film (so called "selenization method").

Furthermore, in the context of the aforementioned technique, there has been proposed a technique in which the stacked precursor film consisting of the Cu—Ga alloy film and the In film is produced by a sputtering method such that a Cu—Ga alloy layer with high content of Ga, a Cu—Ga alloy layer with low content of Ga, and an In layer are stacked in sequence from the metal backside electrode layer side and the stacked precursor film is then subject to heat treatment in a selenium and/or a sulfur atmosphere to thereby gradually (stepwise) change the concentration gradient of Ga in the interior of the thin-film light absorbing layer from the interface layer (buffer layer) side to the metal backside electrode layer side so that a thin-film solar cell having a large open circuit voltage can be realized and the peeling-off of the thin-film light absorbing layer from any other layer can be prevented. In this case, there has been proposed that the content of Ga in a Cu—Ga target is in the range of from 1 to 40 at % (see Patent Document 1).

On the other hand, in order to improve the power generation efficiency of a light absorbing layer consisting of a CIGS film, the addition of Na to the light absorbing layer is known as effective means. For example, Non-Patent Document 1 proposes the fact that the content of Na in a CIGS film is typically about 0.1%.

In order to add Na to a light absorbing layer, there has been proposed a method in which a precursor film consisting of In, Cu, and Ga metal elements is formed on a backside electrode layer formed on a substrate, an aqueous solution containing sodium tetraborate, sodium sulfide, and sodium aluminum sulfate is adhered to the precursor film, and then the resulting precursor film is subject to heat treatment in an $H_2Se$ gas atmosphere for selenization (see Patent Document 2).

PRIOR ART DOCUMENTS

Patent Documents

[Patent Document 1] Japanese Unexamined Patent Publication No. 10-135495
[Patent Document 2] WO 2005/109525

Non-Patent Document

[Non-Patent Document 1] A. Romeo, "Development of Thin-film Cu(In, Ga)Se2 and CdTe Solar Cells", Prog. Photovolt: Res. Appl. 2004; 12:93-111 (DOI: 10.1002/pip.527

SUMMARY OF THE INVENTION

Problems to be Solved by the Invention

The following problems still remain in the conventional techniques described above.

Specifically, in the method disclosed in Patent Document 2, interfacial separation between the backside metal electrode and the light absorbing film can be prevented by forming a Na compound film on the precursor film but a sodium salt aqueous solution must be used. Thus, the manufacturing processes undesirably increase and uniform adherence of a sodium salt aqueous solution to a precursor film becomes difficult when the precursor film is formed on a large-area substrate.

Thus, as a method for directly adding Na to a precursor film, a method for adding Na to various targets for forming, for example, a precursor film to thereby include Na in the precursor film by sputtering is contemplated. However, in the production of solar cells using the selenization method as disclosed in Patent Document 1, a Cu—Ga alloy target is employed for forming a Cu—Ga film, but Na is not in solid solution with Cu, both the melting point (98° C.) and the boiling point (883° C.) of metal Na are very low, and metal Na is extremely readily oxidized. Thus, the addition of metal Na to a Cu—Ga alloy target is extremely difficult.

The present invention has been made in view of the aforementioned circumstances, and an object of the present invention is to provide a sputtering target that is capable of forming a Cu—Ga film, which has an added Ga concentration of 1 to 40 at % and into which Na is well added, by a sputtering method and a method for producing the same.

Means for Solving the Problems

The present inventors have studied to add Na to a Cu—Ga alloy target having a Ga concentration of 1 to 40 at %.

Consequently, the present inventors have found that Na may be favorably added to a Cu—Ga sputtering target if the compound state of Na such as the sodium fluoride, sodium sulfide, or sodium selenide (hereinafter collectively referred to as "Na compound") instead of the metal state of Na is added thereto.

When the Na compound is added to a Cu—Ga alloy target, the target is produced by a powder sintering method. Thus, a Cu—Ga alloy powder, a Na compound powder, and a Cu powder as required are used as starting materials, oxygen contained in these starting materials increases the content of oxygen in the target. Oxygen in the target leads to an increase in the content of oxygen in a precursor film. Furthermore, oxygen is incorporated into a Se site when a CIGS compound crystal is formed, resulting in a reduction in the photoelectric conversion efficiency of a light absorbing layer. Accordingly, the sputtering target of the present invention is characterized in that the Cu—Ga alloy target to which the Na compound has been added has a low content of oxygen of 1,000 ppm or less.

Thus, the present invention has been made on the basis of the finding, and adopts the following configuration in order to overcome the aforementioned problems. Specifically, a sputtering target according to a first aspect of the present invention is characterized in that the sputtering target has a component composition that contains 1 to 40 at % of Ga, 0.05 to 2 at % of Na as metal element components other than F, S and Se, and the balance composed of Cu and unavoidable impurities, wherein the sputtering target contains Na in at least one form selected from among sodium fluoride, sodium sulfide, and sodium selenide and the content of oxygen is from 100 to 1,000 ppm.

The sputtering target has a composition in which the content of oxygen is suppressed within a given range and the content of oxygen in the precursor film obtained by sputtering is controlled, so that the sputtering target can contribute to improvement in the photoelectric conversion efficiency of a light absorbing layer in a CIGS thin-film solar cell.

It should be noted that, in the present invention, the content of Na and the content of Ga are relative to the entire metal element components other than F, S and Se in the sputtering target and are calculated as the ratio thereof to the summation of Cu, Ga, and Na atoms in the target as described below.

Na (at %):Na/(Na+Cu+Ga)×100%

Ga (at %):Ga/(Na+Cu+Ga)×100%

The reason why the amount of sodium (Na) added contained in at least one form selected from among sodium fluoride, sodium sulfide, and sodium selenide is set within the above range is as follows. If the amount of Na added exceeds 2 at %, Na contained in the Cu—Ga film is segregated at the interface between the Cu—Ga film and the Mo film serving as the metal backside electrode, resulting in a reduction in the adhesion between the Mo film and the Cu—Ga—In—Se film. On the other hand, if the amount of Na added is less than 0.05 at %, the amount of Na in the film is in short, and thus, the effect of improving power generation efficiency may not be obtained. It should be noted that the content of Na in the Cu—Ga sputtering target is preferably in the range of from 0.1 at % to 0.5 at % from the viewpoint of the power generation efficiency.

Also, the reason why the content of oxygen in the target is set within the range is as follows. If the content of oxygen exceeds 1,000 ppm, the oxygen concentration in a Na-containing Cu—Ga film obtained by sputtering increases, resulting in a reduction in the photoelectric conversion efficiency after forming the CIGS compound. On the other hand, the content of oxygen in the starting material powder needs to be reduced in order to set the content of oxygen to be less than 100 ppm, resulting in an increase in the cost of manufacturing the target.

A sputtering target according to a second aspect of the present invention is characterized in that the sputtering target has a structure in which at least one selected from among a NaF compound phase, a $Na_2S$ compound phase, and a $Na_2Se$ compound phase is dispersed in a target material and the average particle diameter of the NaF compound phase, the $Na_2S$ compound phase, and the $Na_2Se$ compound phase is 5 μm or less according to the first aspect of the present invention.

When the compound state of Na is added to a Cu—Ga alloy target and direct-current sputtering is performed using the Cu—Ga alloy target, abnormal electrical discharge caused by an insulating Na compound may easily occur. Since the light absorbing layer of a solar cell is very thick (e.g., 1,000 nm to 2000 nm), that is, the Cu—Ga film is very thick, the film-forming speed is lowered when sputtering is performed with low sputtering power for suppressing abnormal electrical discharge, resulting in a difficulty in high speed sputtering required for mass production. In order to suppress such abnormal electrical discharge, the sputtering target of the present invention enables direct-current sputtering to be performed under the same sputtering conditions as that for the conventional Cu—Ga alloy target by optimizing the particle size of the Na compound.

Specifically, in the sputtering target of the present invention, the average particle diameter of the Na compound phases is 5 μm or less, whereby abnormal electrical discharge caused by the Na compound may be suppressed and thus stable direct-current sputtering becomes possible.

It should be noted that, when the cross-sectional structure of the target is observed using an SEM, it is preferable from the viewpoint of suppressing abnormal electrical discharge that the number of Na compound particles having a circumscribed circle diameter of 10 μm or greater in the field of view of about 0.1 $mm^2$ is five or less.

A sputtering target according to a third aspect of the present invention is characterized in that the average particle diameter of the metal phase in the target material is from 10 to 100 μm according to the first or the second aspect of the present invention.

When a Na compound is added, particles of the Na compound are readily and uniformly dispersed by using a fine Cu—Ga powder or a fine Cu powder, a specific surface area increased due to the fineness of the metal powder, resulting in an increase in the content of oxygen. On the other hand, when the particle diameter of the metal phase increases, dispersion of the Na compound becomes insufficient. In the target produced by using a starting material powder having a large particle diameter, the particle diameter of the metal phase after sintering exceeds 100 μm, so that the Na compound is readily concentrated on the grain boundary of the metal phase. Consequently, chipping may easily occur on the target during machine processing.

In order to overcome these disadvantages, in the sputtering target of the present invention, the average particle diameter (diameter of a circle equivalent to a projected area) of the metal phase in the target material is from 10 to 100 μm, so that the target with little chipping can be produced during machine processing. In addition, the target also provides the effect of suppressing abnormal electrical discharge, resulting in achieving stable sputtering and an improvement in sputtering crack resistance.

A method for producing a sputtering target according to a fourth aspect of the present invention is a method for producing the sputtering target according to any one of the first to third aspects of the present invention and is characterized in that the method includes a step of sintering a formed product consisting of a mixed powder of at least one selected from among a NaF compound powder, a $Na_2S$ compound powder, and a $Na_2Se$ compound powder and a Cu—Ga alloy powder or a formed product consisting of a mixed powder of at least one selected from among a NaF compound powder, a $Na_2S$ compound powder, and a $Na_2Se$ compound powder, a Cu—Ga alloy powder, and a Cu powder in a vacuum, in an inert gas atmosphere, or in a reducing atmosphere (hereinafter referred to as "ordinary-pressure sintering method").

A method for producing a sputtering target according to a fifth aspect of the present invention is a method for producing the sputtering target according to any one of the first to third aspects of the present invention and is characterized in that the method includes a step of hot pressing a mixed powder of at least one selected from among a NaF compound powder, a $Na_2S$ compound powder, and a $Na_2Se$ compound powder and a Cu—Ga alloy powder or a mixed powder of at least one selected from among a NaF compound powder, a $Na_2S$ compound powder, and a $Na_2Se$ compound powder, a Cu—Ga alloy powder, and a Cu powder in a vacuum or an inert gas atmosphere (hereinafter referred to as "hot pressing method").

A method for producing a sputtering target according to a sixth aspect of the present invention is a method for producing the sputtering target according to any one of the first to third aspects of the present invention and is characterized in that the method includes a step of sintering a mixed powder of at least one selected from among a NaF compound powder, a $Na_2S$ compound powder, and a $Na_2Se$ compound powder and a Cu—Ga alloy powder or a mixed powder of at least one selected from among a NaF compound powder, a $Na_2S$ compound powder, and a $Na_2Se$ compound powder, a Cu—Ga alloy powder, and a Cu powder by hot isostatic pressing (hereinafter referred to as "HIP method").

Specifically, these methods for producing a sputtering target are capable of uniformly distributing the Na compound in a dispersed manner by sintering the mixed powder using a powder sintering method as compared with the target produced by a melting method by adding the Na compound thereto.

The target produced by the melting method has low mechanical strength because of segregation of the Na compound in the grain boundary, and thus, is susceptible to cracking during machine processing. Furthermore, since the Na compound is strongly evaporated or decomposed at a temperature of 1,000° C. or greater under atmospheric pressure, the content of the Na compound significantly fluctuates in a Na compound-containing Cu—Ga alloy target produced by a melting/casting method at a temperature of 1,000° C. or greater. In contrast, in the sputtering target produced by the production method of the present invention which is a powder sintering method, the Na compound is present as aggregate in a matrix of a "Cu—Ga alloy sintered phase" or a sintered phase consisting of "Cu—Ga alloy" and "Cu" in a dispersed manner, resulting in no reduction in the strength of the target. In addition, the stable film deposition may be realized without the occurrence of cracking or chipping during machine processing and without the occurrence of cracking during sputtering.

A method for producing a sputtering target according to a seventh aspect of the present invention is characterized in that the formed product is sintered at a temperature of 700 to 950° C.

A method for producing a sputtering target according to an eighth aspect of the present invention is characterized in that the hot pressing is performed at a temperature of 500 to 900° C. according to the fifth aspect of the present invention.

A method for producing a sputtering target according to a ninth aspect of the present invention is characterized in that the hot isostatic pressing is performed at a temperature of 500 to 900° C. according to the sixth aspect of the present invention.

Specifically, in these methods for producing the sputtering target of the present invention, sintering is performed under the aforementioned conditions. Thus, a sputtering target having a high sputtering crack resistance may be obtained with little risk of abnormal electrical discharge during sputtering.

In a seventh aspect of the present invention, the reason why a sintering temperature is set within the above range is as follows. If the sintering temperature is lower than 700° C., the density of the sputtering target becomes insufficient, and thus, abnormal electrical discharge often occurs during sputtering of the sputtering target. On the other hand, if the sintering temperature exceeds 950° C., the evaporation of the Na compound may start, and thus, the composition of the target may be different from the target composition thereof. Note that the sintering temperature is preferably within the range of from 700° C. to 850° C.

In an eighth aspect of the present invention, the reason why a hot pressing temperature is set within the above range is as follows. If the hot pressing temperature is lower than 500° C., the density of the sputtering target becomes insufficient, and thus, abnormal electrical discharge often occurs during sputtering of the sputtering target. On the other hand, if the hot pressing temperature exceeds 900° C., the NaF compound or the $Na_2S$ compound or the $Na_2Se$ compound is moved to the grain boundary of a Cu—Ga alloy powder or a Cu powder during sintering, resulting in a reduction in the strength of a sintered body. Consequently, cracking or chipping may easily occur during machine processing or during sputtering. Note that the hot pressing temperature is preferably within the range of from 650° C. to 850° C.

In a ninth aspect of the present invention, the reason why an HIP processing temperature is set within the above range is as follows. If the sintering temperature is lower than 500° C., the density of the sputtering target becomes insufficient, and thus, abnormal electrical discharge often occurs during sputtering of the sputtering target. On the other hand, if the sintering temperature exceeds 900° C., the strength of a sintered body becomes low, and thus, chipping may easily occur during machine processing and cracking may easily occur during sputtering. Note that the sintering temperature is preferably within the range of 550° C. to 650° C.

Effects of the Invention

According to the present invention, the following effects may be provided.

Specifically, according to the sputtering target of the present invention and the method for producing the same, the sputtering target has a component composition that contains 1 to 40 at % of Ga, 0.05 to 2 at % of Na as metal element components other than F, S and Se, and the balance composed of Cu and unavoidable impurities, wherein the sputtering target contains Na in at least one form selected from among sodium fluoride, sodium sulfide, and sodium selenide and the content of oxygen is from 100 to 1,000 ppm. Hence, a Cu—Ga film containing Na which is effective for the improvement in power generation efficiency may be formed using the sputtering method. Thus, the sputtering target of the present invention can be employed so as to form a light absorbing layer for a CIGS thin-film solar cell using the sputtering method because the required amount of Na may favorably be added to a light absorbing layer, so that a CIGS thin-film solar cell exhibiting high power generation efficiency can be produced.

BRIEF DESCRIPTION OF THE DRAWINGS

The FIGURE is an optical microscope photograph illustrating a sputtering target after etching according to the sputtering target and the method for producing the same in Example 1 of the present invention.

DESCRIPTION OF THE EMBODIMENTS

Hereinafter, a description will be given of one embodiment of the sputtering target of the present invention and a method for producing the same.

The sputtering target of the present embodiment is characterized in that the sputtering target has a component composition that contains 1 to 40 at % of Ga, 0.05 to 2 at % of Na as metal element components other than F, S and Se, and the balance composed of Cu and unavoidable impurities, wherein the sputtering target contains Na in at least one form selected from among sodium fluoride, sodium sulfide, and sodium selenide and the content of oxygen is from 100 to 1,000 ppm.

The sputtering target of the present embodiment is characterized in that the sputtering target is formed into a target material in a metal phase consisting of a Cu—Ga alloy sintered phase or a sintered phase of a Cu—Ga alloy and Cu and has a structure in which at least one selected from among a NaF compound phase, a $Na_2S$ compound phase, and a $Na_2Se$ compound phase is dispersed in the target material and the average particle diameter of the NaF compound phase, the $Na_2S$ compound phase, and the $Na_2Se$ compound phase is 5 μm or less.

It should be noted that, when the cross-sectional structure of the target is observed using an SEM, the number of Na compound particles having a circumscribed circle diameter of 10 μm or greater in the field of view of about 0.1 mm² is preferably five or less.

Furthermore, the sputtering target of the present embodiment is characterized in that the average particle diameter (diameter of a circle equivalent to a projected area) of the metal phase in the target material is from 10 to 100 μm.

The method for producing samples for observation for measuring the average particle diameter thereof and the calculation of the average particle diameter thereof are as follows.

(1) The sintered sputtering target is cut at any section to thereby produce a block-shaped sample with a size of about 5×10×3 mm.

(2) The sample is polished until Ra reaches 0.5 μm or less to thereby produce an observation plane. Furthermore, the observation plane is subject to etching by being immersed into an etching solution (50 ml pure water, 5 ml aqueous hydrogen peroxide, and 45 ml ammonia water) for five seconds.

(3) The alloy structure of the etching surface as shown in the FIGURE with a magnification of 250 times is photographed by an optical microscope. At this time, the cross-sectional area of the crystal in the field of view of 500 μm×1,000 μm is calculated in terms of the diameter of a circle equivalent to a projected area to thereby calculate the average particle diameter of particles in the field of view.

The method for producing the sputtering target of the present embodiment is categorized into the following three sintering methods by preparing a mixed powder of at least one selected from among a NaF compound powder, a $Na_2S$ compound powder, and $Na_2Se$ compound powder and a Cu—Ga alloy powder or a mixed powder of at least one selected from among a NaF compound powder, a $Na_2S$ compound powder, and a $Na_2Se$ compound powder, a Cu—Ga alloy powder, and a Cu powder in advance.

1. The mixed powder is filled in a die, is filled in a forming product or a forming mold molded by cold-pressing, and is subject to tapping to thereby form a formed product having a constant bulk density. Then, the formed product is subject to sintering at a temperature of from 700° C. to 950° C. in vacuum, in an inert gas atmosphere, or in a reducing atmosphere.

2. The mixed powder is subject to hot pressing at a temperature in the range of from 500° C. to 900° C. in vacuum or in an inert gas atmosphere.

3. The mixed powder is subject to sintering at a temperature of from 500° C. to 900° C. and a pressure of from 30 MPa to 150 MPa by the HIP method.

The mixed powder is prepared using any one of the following methods (1) to (3).

(1) The NaF compound, the $Na_2S$ compound, or the $Na_2Se$ compound has a purity of 3N or greater and preferably has a primary particle diameter of from 0.01 to 1.0 μm in consideration of the suppression of an increase in the content of oxygen and the mixability between a Cu—Ga alloy powder and a Cu powder. In order to reduce the content of oxygen in the target to the level of 1,000 ppm or less, adsorbed moisture contained in the Na compound needs to be removed in advance before mixing. For example, it is effective to dry the mixed powder in a vacuum drier in a vacuum environment at a temperature of 120° C. for 10 hours.

Pulverization is performed by a pulverizing device (e.g., ball mill, jet mill, Henshell mixer, attritor, or the like). The obtained mean secondary particle diameter is preferably from 1 μm to 5 μm. The pulverization step is preferably performed in a dried environment at a humidity RH of 40% or less. Furthermore, the NaF compound, the $Na_2S$ compound, or the $Na_2Se$ compound exhibits strong moisture absorptivity and is dissolved into water. Thus, a wet-type mixing and pulverizing device with water is inappropriate for the NaF compound, the $Na_2S$ compound, or the $Na_2Se$ compound. Note that, when the Na compound is pulverized, the Na compound is preferably dried before mixing. For example, it is effective to dry the Na compound in a vacuum drier in a vacuum environment at a temperature of 120° C. for 10 hours in the same fashion as described above.

Furthermore, the dried pulverized powder and the Cu—Ga alloy powder having a target composition are mixed by using a dry-type mixing device in a dried environment with a relative humidity RH of 40% or less to thereby prepare a starting material powder for sintering. Note that mixing is more preferably performed in a reducing atmosphere. In order to achieve both the suppression of an increase in the content of oxygen and the mixability during mixing, the average particle diameter of the Cu—Ga alloy powder is preferably in the range of from 1 to 150 µm. Furthermore, the Cu—Ga powder is pulverized by the pulverization effect during mixing by setting the average particle diameter of the Cu—Ga alloy powder to 150 µm or less, so that the crystal particle size of the metal phase in the sintered body target can be suppressed to a level of 100 µm or less. When the particle diameter of the metal phase in the sintered body exceeds 100 µm, the Na compound is readily concentrated on the grain boundary of the metal phase. Consequently, chipping may easily occur on the target during machine processing.

Note that, when adsorbed moisture contained in the mixed powder after mixing needs to be removed, it is effective to dry the mixed powder in a vacuum drier in a vacuum environment at a temperature of 80° C. for three hours or longer.

(2) The NaF compound, the $Na_2S$ compound, or the $Na_2Se$ compound has a purity of 3N or greater and preferably has a primary particle diameter of from 0.01 to 0.5 µm in consideration of the suppression of an increase in the content of oxygen and the mixability between a Cu—Ga alloy powder and a Cu powder. In order to reduce the content of oxygen in the target to the level of 1,000 ppm or less, adsorbed moisture contained in the Na compound needs to be removed in advance before mixing. For example, it is effective to dry the Na compound in a vacuum drier in a vacuum environment at a temperature of 120° C. for 10 hours. The dried Na compound and the previously prepared Cu—Ga alloy powder having a target composition are simultaneously filled in a pulverizing device (e.g., ball mill, jet mill, Henshell mixer, attritor, V-type mixer, or the like) to thereby simultaneously perform mixing and pulverizing the Na compound. Pulverization is ended when the mean secondary particle diameter of the NaF compound, the $Na_2S$ compound, or the $Na_2Se$ compound reaches 5 µm or less to thereby produce a starting material powder. In order to achieve both the suppression of an increase in the content of oxygen and the mixability during mixing, the average particle diameter of the Cu—Ga alloy powder is preferably in the range of from 1 to 150 µm. Mixing is preferably performed in a dried environment with a humidity RH of 40% or less and is more preferably performed in a reducing atmosphere. Note that, when adsorbed moisture contained in the mixed powder after mixing needs to be removed, it is effective to dry the mixed powder in a vacuum drier in a vacuum environment at a temperature of 80° C. for three hours or longer.

(3) Firstly, the Cu—Ga alloy powder is prepared in advance such that the content of Ga is set to be greater than the proportion of Cu/Ga in the target composition. The Cu—Ga alloy powder is mixed with the dried Na compound and then the Cu—Ga alloy powder (or Cu powder) with a low content of Ga is added to and uniformly mixed with the resulting mixture to thereby produce a starting material powder. The aforementioned mixing is performed in a low humidity environment as described in (1) and (2). The mixing is more preferably performed in a reducing atmosphere. In consideration of the suppression of an increase in the content of oxygen and the mixability between a Cu—Ga alloy powder and a Cu powder, the average particle diameter of the Cu—Ga alloy powder is preferably in the range of from 1 to 150 µm. On the other hand, when the Cu powder is used, the average particle diameter of the Cu powder is preferably in the range of from 0.1 to 30 µm. Note that, when adsorbed moisture contained in the mixed powder after mixing needs to be removed, it is effective to dry the mixed powder in a vacuum drier in a vacuum environment at a temperature of 80° C. for three hours or longer.

Next, the starting material powder mixed by any one of these methods (1) to (3) is encapsulated and stored in a plastic resin pouch in a dried environment with RH of 30% or less. This is for the purpose of preventing water moisture absorption due to the presence of the Na compounds or aggregation of particles due to moisture absorption from being occurred.

Also, in order to prevent oxidization of a Cu—Ga alloy or Cu during sintering, ordinary-pressure sintering, hot pressing, or HIP is carried out in a reducing atmosphere, in a vacuum, or in an inert gas atmosphere.

In the ordinary-pressure sintering, the presence of hydrogen in an atmosphere is advantageous in providing improvement of sinterability when the NaF compound is added. The content of hydrogen in an atmosphere is preferably 1% or greater and more preferably 80% or greater. On the other hand, when $Na_2S$ or $Na_2Se$ is added, hydrogen in a sintering atmosphere reacts with sulfur or selenium, resulting in a difficulty in obtaining a sintered body with high density. In this case, a sintered body with high density can be realized by sintering in vacuum or in a reducing atmosphere.

The pressure applied during hot pressing may greatly affect the density of the target sintered body, and thus, the pressure to be applied during hot pressing is preferably in the range of 100 kgf/cm$^2$ to 500 kgf/cm$^2$. Also, pressurization may be performed prior to the start of the elevation of temperature for sintering or may be applied after a certain hot pressing temperature is reached.

In the HIP method, pressure to be applied is preferably in the range of from 500 to 1,500 kgf/cm$^2$.

Although a sintering time for a sintered body may change depending on the composition thereof, the sintering time is preferably in the range of from 1 to 10 hours. When the sintering time is shorter than 1 hour, sintering becomes insufficient so that there is a high probability that chipping occurs during processing of the target and abnormal electrical discharge occurs during sputtering. On the other hand, even when the sintering time is longer than 10 hours, almost no density-improving effect is provided.

Next, the Cu—Ga—Na compound sintered body sintered by the aforementioned method is processed into a specified shape of a target using regular discharge processing, cutting, or grinding processing. At this time, since the Na compound dissolves with water, a dry-type method without using a coolant or a wet-type method with using a water-free coolant is preferably used upon processing. Also, after processing the surface of a target in advance using a wet-type method, the surface thereof is further subject to precision machining by a dry-type method.

Next, the processed sputtering target is bonded to a backing plate consisting of Cu or SUS (stainless) or other metal (e.g., Mo) using In as a solder, and the resulting target is provided to sputtering.

In order to prevent oxidization and moisture absorption of the processed target from being occurred, the entire target is preferably stored in a vacuum pack or a pack purged with inert gas.

The thus produced Cu—Ga—Na compound target is subject to direct-current (DC) magnetron sputtering using Ar gas as sputtering gas. For the direct-current sputtering, a pulse DC power supply for applying a pulse voltage or a non-pulse DC power supply may also be employed. The input power during sputtering is preferably in the range of from 1 W/cm$^2$ to 10 W/cm$^2$. The thickness of the film formed on the Cu—Ga—Na compound target is in the range of from 200 nm to 2,000 nm.

Since the sputtering target of the present embodiment has a component composition that contains 1 to 40 at % of Ga, 0.05 to 2 at % of Na as metal element components other than F, S and Se, and the balance composed of Cu and unavoidable impurities, wherein the sputtering target contains Na in at least one form selected from among sodium fluoride, sodium sulfide, and sodium selenide and the content of oxygen is from 100 to 1,000 ppm, a Cu—Ga film favorably containing Na which is effective for the improvement in power generation efficiency may be formed using the sputtering method. The sputtering target has a composition in which the content of oxygen is suppressed within a given range and the content of oxygen in the precursor film obtained by sputtering is suppressed, so that the sputtering target can contribute to improvement in the photoelectric conversion efficiency of a light absorbing layer in a CIGS thin-film solar cell.

Also, the sputtering target has a structure in which at least one selected from among a NaF compound phase, a $Na_2S$ compound phase, and a $Na_2Se$ compound phase is dispersed in a target material and the average particle diameter of the NaF compound phase, the $Na_2S$ compound phase, and the $Na_2Se$ compound phase is 5 µm or less, and thus, stable direct-current sputtering becomes possible by suppressing abnormal electrical discharge caused by the Na compound.

Furthermore, the average particle diameter (diameter of a circle equivalent to a projected area) of the metal phase in the target material is from 10 to 100 µm, so that chipping during machine processing can be suppressed, resulting in achieving stable sputtering without the occurrence of cracking or abnormal electrical discharge during sputtering.

In the method for producing the sputtering target of the present embodiment, the aforementioned mixed powder is sintered in a vacuum or in an inert gas atmosphere, so that the NaF compound, the $Na_2S$ compound, or the $Na_2Se$ compound may be dispersed and distributed in a uniform manner as compared with the target produced by a melting method.

EXAMPLES

Next, the sputtering target of the present invention and a method for producing the same will be specifically described with reference to the evaluation result of the actually produced sputtering target by way of Examples, based on the aforementioned embodiment.

Examples

Firstly, a Cu—Ga alloy powder and a Cu powder (purity 4N) having the component composition and the particle diameter shown in Table 1 were blended with a NaF compound powder, a $Na_2S$ compound powder, or a $Na_2Se$ compound powder each having a purity of 3N and a primary mean particle diameter of 0.5 µm so as to achieve the amount thereof as shown in Table 1 to thereby produce a starting material powder in each of Examples 1 to 35. Each of these starting material powder was firstly dried in a vacuum drier in a vacuum environment of $10^{-1}$ Pa at a temperature of 120° C. for 10 hours, and then was placed in a polyethylene pot having a volume of 10 L. Then, a zirconia ball having a diameter of 5 mm dried at a temperature of 120° C. for 10 hours was further added in the pot, and the resulting mixture was mixed in a ball mill for a specified time. Mixing was performed in a nitrogen atmosphere.

The obtained mixed powder was sintered under the condition as specified in Table 2. In the case of ordinary-pressure sintering, the mixed powder was firstly filled in a metal mold, and then pressurized at normal temperatures at a pressure of 1,500 kg/cm$^2$ to thereby form a formed product. In the case of hot pressing, the starting material powder was subject to vacuum hot pressing by being filled in a graphite mold. In the case of hot isostatic pressing (HIP) as in ordinary-pressure sintering, the mixed powder was firstly filled in a metal mold, and was pressure-molded at normal temperatures at a pressure of 1,500 kgf/cm$^2$. The obtained formed product was put into a stainless container having a thickness of 0.5 mm, and was encapsulated in the plastic resin pouch through vacuum de-aeration to thereby be used for HIP processing.

These sintered bodies were subject to dry-type cutting to thereby produce targets (Examples 1 to 35) each having a diameter of 125 (mm) and a thickness of 5 (mm).

TABLE 1

| | Cu—Ga(I) | | | Cu—Ga(II) | | | Cu | | NaF | Na₂S | Na₂Se | MIXING TIME (hour) |
|---|---|---|---|---|---|---|---|---|---|---|---|---|
| | AVERAGE PARTICLE DIAMETER (μm) | ATOMIC RATIO COMPOSITION (Ga/Ga + Cu) | AMOUNT ADDED (g) | AVERAGE PARTICLE DIAMETER (μm) | ATOMIC RATIO COMPOSITION (Ga/Ga + Cu) | AMOUNT ADDED (g) | AVERAGE PARTICLE DIAMETER (μm) | AMOUNT ADDED (g) | AMOUNT ADDED (g) | AMOUNT ADDED (g) | AMOUNT ADDED (g) | |
| EXAMPLE 1 | 62 | 0.15 | 6250 | — | — | — | — | — | 63.0 | — | — | 3 |
| EXAMPLE 2 | 51 | 0.10 | 6350 | — | — | — | — | — | 21.0 | — | — | 1 |
| EXAMPLE 3 | 30 | 0.10 | 3200 | 20 | 0.3 | 3200 | — | — | 21.0 | — | — | 4 |
| EXAMPLE 4 | 45 | 0.10 | 3200 | 20 | 0.3 | 3200 | — | — | 21.0 | — | — | 4 |
| EXAMPLE 5 | 40 | 0.05 | 6150 | — | — | — | — | — | 84.0 | — | — | 3 |
| EXAMPLE 6 | 76 | 0.10 | 6400 | — | — | — | — | — | 2.1 | — | — | 3 |
| EXAMPLE 7 | 103 | 0.10 | 6300 | — | — | — | — | — | 2.1 | — | — | 3 |
| EXAMPLE 8 | 50 | 0.03 | 6400 | — | — | — | — | — | 21.0 | — | — | 1 |
| EXAMPLE 9 | 118 | 0.15 | 6400 | — | — | — | — | — | 21.0 | — | — | 4 |
| EXAMPLE 10 | 66 | 0.15 | 4900 | 70 | 0.2 | 3200 | — | — | 21.0 | — | — | 2 |
| EXAMPLE 11 | 70 | 0.15 | 4900 | — | — | — | — | — | 21.0 | — | — | 2 |
| EXAMPLE 12 | 83 | 0.10 | 3200 | — | — | — | — | — | — | 19.5 | — | 2 |
| EXAMPLE 13 | 110 | 0.20 | 6400 | — | — | — | — | — | — | 39.0 | — | 3 |
| EXAMPLE 14 | 105 | 0.20 | 6400 | — | — | — | — | — | — | 39.0 | — | 3 |
| EXAMPLE 15 | 60 | 0.10 | 6400 | — | — | — | — | — | — | 3.0 | — | 4 |
| EXAMPLE 16 | 94 | 0.15 | 6400 | — | — | — | — | — | — | — | 31.2 | 2 |
| EXAMPLE 17 | 20 | 0.20 | 6400 | — | — | — | — | — | — | — | 62.5 | 2 |
| EXAMPLE 18 | 95 | 0.08 | 4200 | — | — | — | 1 | 1500 | — | — | 125.0 | 3 |
| EXAMPLE 19 | 22 | 0.15 | 6400 | — | — | — | 1 | 1500 | 8.4 | 7.8 | 6.2 | 4 |
| EXAMPLE 20 | 25 | 0.15 | 6400 | — | — | — | — | — | 8.4 | 7.8 | 6.2 | 4 |
| EXAMPLE 21 | 60 | 0.30 | 6400 | — | — | — | — | — | — | 39.0 | — | 3 |
| EXAMPLE 22 | 35 | 0.40 | 6550 | — | — | — | — | — | 20.0 | — | — | 3 |
| EXAMPLE 23 | 25 | 0.20 | 6350 | — | — | — | — | — | 40.0 | — | — | 2 |
| EXAMPLE 24 | 45 | 0.30 | 6475 | — | — | — | — | — | 22.0 | — | — | 4 |
| EXAMPLE 25 | 145 | 0.30 | 6500 | — | — | — | — | — | 10.0 | — | — | 5 |
| EXAMPLE 26 | 110 | 0.30 | 6540 | — | — | — | — | — | 2.0 | — | — | 4 |
| EXAMPLE 27 | 70 | 0.30 | 6400 | — | — | — | 1 | 2509 | 40.0 | — | — | 3 |
| EXAMPLE 28 | 150 | 0.32 | 3900 | 40 | 0.13 | 2900 | — | — | 20.0 | 19.5 | — | 2 |
| EXAMPLE 29 | 90 | 0.25 | 3500 | — | — | — | 0.5 | 2195 | — | — | — | 3 |
| EXAMPLE 30 | 44 | 0.45 | 4300 | 110 | 0.17 | 2710 | — | — | 20.0 | — | — | 4 |
| EXAMPLE 31 | 63 | 0.40 | 3800 | — | — | — | 2 | 2509 | 10.0 | — | — | 3 |
| EXAMPLE 32 | 35 | 0.30 | 3900 | — | — | — | — | — | 20.0 | — | — | 2 |
| EXAMPLE 33 | 45 | 0.30 | 6500 | — | — | — | — | — | 20.0 | — | — | 4 |
| EXAMPLE 34 | 25 | 0.47 | 4300 | — | — | — | 4 | 2195 | 20.0 | — | — | 4 |
| EXAMPLE 35 | 65 | 0.30 | 6400 | — | — | — | — | — | — | — | 62.5 | 3 |

TABLE 2

| | SINTERING METHOD | SINTERING CONDITION | | | SINTERED BODY COMPOSITION | | | | OXYGEN CONTENT IN SINTERED BODY (ppm) | MEAN PARTICLE DIAMETER OF Na COMPOUND IN SINTERED BODY (μm) | MEAN PARTICLE DIAMETER OF METAL PHASE IN SINTERED BODY (μm) | THE NUMBER OF NaF AGGREGATE PARTICLES WITH THE SIZE OF 10 μm OR GREATER IN THE AREA OF 0.1 mm² |
|---|---|---|---|---|---|---|---|---|---|---|---|---|
| | | TEMPERATURE (°C.) | PRESSURE (kgf/cm²) | KEEP TIME (HOUR) | Na (at %)* | Ga (at %)* | Cu (at %) | | | | | |
| EXAMPLE 1 | HP | 800 | 150 | 1.5 | 1.48 | 14 | REMAINING | | 354 | 3.2 | 53 | 3 |
| EXAMPLE 2 | HP | 900 | 100 | 3.0 | 0.48 | 9 | REMAINING | | 230 | 4.7 | 49 | 2 |
| EXAMPLE 3 | HP | 650 | 350 | 2.0 | 0.49 | 22 | REMAINING | | 261 | 3.9 | 38 | 1 |
| EXAMPLE 4 | ORDINARY-PRESSURE SINTERING# | 800 | — | 2.0 | 0.51 | 21 | REMAINING | | 220 | 3.3 | 42 | 1 |
| EXAMPLE 5 | HP | 900 | 200 | 3.0 | 2 | 6 | REMAINING | | 594 | 3.4 | 39 | 3 |
| EXAMPLE 6 | HP | 700 | 300 | 3.0 | 0.06 | 9 | REMAINING | | 200 | 1.0 | 85 | 0 |
| EXAMPLE 7 | HIP | 500 | 1200 | 3.0 | 0.05 | 9 | REMAINING | | 215 | 0.9 | 94 | 0 |
| EXAMPLE 8 | HP | 900 | 150 | 2.0 | 0.41 | 3 | REMAINING | | 400 | 4.0 | 62 | 1 |
| EXAMPLE 9 | HP | 700 | 250 | 1.5 | 0.45 | 15 | REMAINING | | 278 | 3.3 | 96 | 2 |
| EXAMPLE 10 | HP | 650 | 500 | 4.0 | 0.48 | 16 | REMAINING | | 750 | 3.6 | 48 | 1 |
| EXAMPLE 11 | ORDINARY-PRESSURE SINTERING## | 850 | — | 3.0 | 0.43 | 15 | REMAINING | | 841 | 3.4 | 81 | 1 |
| EXAMPLE 12 | HP | 750 | 300 | 2.0 | 0.49 | 14 | REMAINING | | 453 | 3.1 | 48 | 1 |
| EXAMPLE 13 | HP | 800 | 200 | 2.0 | 1.01 | 21 | REMAINING | | 911 | 3.7 | 95 | 4 |
| EXAMPLE 14 | HIP | 800 | 600 | 1.0 | 0.95 | 22 | REMAINING | | 821 | 3.4 | 83 | 1 |
| EXAMPLE 15 | HP | 650 | 400 | 1.0 | 0.07 | 9 | REMAINING | | 468 | 2.1 | 45 | 0 |
| EXAMPLE 16 | HP | 750 | 150 | 2.0 | 0.46 | 16 | REMAINING | | 457 | 4.1 | 91 | 3 |
| EXAMPLE 17 | HP | 700 | 250 | 3.0 | 1.02 | 19 | REMAINING | | 872 | 4.5 | 31 | 2 |
| EXAMPLE 18 | HP | 850 | 350 | 1.0 | 1.89 | 6 | REMAINING | | 956 | 4.9 | 82 | 5 |
| EXAMPLE 19 | HP | 600 | 450 | 4.0 | 0.48 | 16 | REMAINING | | 764 | 3.9 | 25 | 3 |
| EXAMPLE 20 | HIP | 500 | 1000 | 1.0 | 0.47 | 16 | REMAINING | | 738 | 3.2 | 24 | 5 |
| EXAMPLE 21 | HP | 750 | 300 | 2.0 | 0.96 | 31 | REMAINING | | 462 | 1.2 | 75 | 1 |
| EXAMPLE 22 | | 600 | 100 | 3.0 | 0.5 | 39 | REMAINING | | 274 | 0.7 | 42 | 1 |
| EXAMPLE 23 | | 780 | 150 | 1.5 | 0.9 | 21 | REMAINING | | 210 | 4.1 | 35 | 2 |

TABLE 2-continued

| | SINTERING CONDITION | | | | SINTERED BODY COMPOSITION | | | OXYGEN CONTENT IN SINTERED BODY (ppm) | MEAN PARTICLE DIAMETER OF Na COMPOUND IN SINTERED BODY (μm) | MEAN PARTICLE DIAMETER OF METAL PHASE IN SINTERED BODY (μm) | THE NUMBER OF NaF AGGREGATE PARTICLES WITH THE SIZE OF 10 μm OR GREATER IN THE AREA OF 0.1 mm$^2$ |
|---|---|---|---|---|---|---|---|---|---|---|---|
| | SINTERING METHOD | TEMPERATURE (° C.) | PRESSURE (kgf/cm$^2$) | KEEP TIME (HOUR) | Na (at %)* | Ga (at %)* | Cu (at %) | | | | |
| EXAMPLE 24 | | 700 | 300 | 2.0 | 0.48 | 31 | REMAINING | 238 | 0.9 | 30 | 0 |
| EXAMPLE 25 | | 650 | 250 | 3.0 | 0.23 | 30 | REMAINING | 145 | 1.2 | 93 | 0 |
| EXAMPLE 26 | | 750 | 150 | 3.0 | 0.05 | 29 | REMAINING | 184 | 1.4 | 91 | 0 |
| EXAMPLE 27 | | 700 | 200 | 3.0 | 0.98 | 31 | REMAINING | 356 | 3.1 | 72 | 1 |
| EXAMPLE 28 | | 700 | 200 | 2.0 | 0.46 | 21 | REMAINING | 438 | 2.2 | 85 | 2 |
| EXAMPLE 29 | | 800 | 150 | 1.5 | 0.47 | 22 | REMAINING | 631 | 2.4 | 58 | 1 |
| EXAMPLE 30 | | 600 | 300 | 4.0 | 0.48 | 29 | REMAINING | 288 | 1.2 | 53 | 0 |
| EXAMPLE 31 | | 600 | 300 | 3.0 | 0.25 | 29 | REMAINING | 466 | 2.2 | 80 | 1 |
| EXAMPLE 32 | ORDINARY-PRESSURE SINTERING# | 700 | — | 2.0 | 0.6 | 21 | REMAINING | 498 | 2.6 | 45 | 2 |
| EXAMPLE 33 | ORDINARY-PRESSURE SINTERING## | 800 | — | 2.0 | 0.4 | 31 | REMAINING | 267 | 2.1 | 52 | 1 |
| EXAMPLE 34 | HIP | 600 | 800 | 1.0 | 0.4 | 30 | REMAINING | 462 | 1.4 | 35 | 0 |
| EXAMPLE 35 | | 600 | 1200 | 1.0 | 1 | 29 | REMAINING | 869 | 2.2 | 53 | 1 |

100% H2 ATMOSPHERE
97% N2, 3% H2 ATMOSPHERE
*Na CONTENT IN SINTERED BODY = Na/(Na + Cu + Ga) × 100
*Ga CONTENT IN SINTERED BODY = Ga/(Na + Cu + Ga) × 100

In the present Examples 1 to 35, the presence/absence of chipping and cracking in the targets during processing was recorded and the oxygen concentration for a piece of each of the sintered bodies for analysis was further analyzed by a non-dispersion infrared absorption method.

On the other hand, the Na compound particles in each sintered body were observed using an electron-probe micro analyzer (EPMA) (JXA-8500F manufactured by Nihon Densi Corporation).

Also, two photographs (500 times) in the observation field-of-view of 0.05 mm$^2$ were taken. Among them, the size of the observable particles (0.5 µm or greater) of the NaF compound, the Na$_2$S compound, or the Na$_2$Se compound was measured to thereby calculate the average particle size. At the same time, the number of aggregate particles (two in total) of the NaF compound, the Na$_2$S compound, or the Na$_2$Se compound having the particle diameter of 10 µm or greater per 0.1 mm$^2$ was calculated.

Note that the average size of particles of the NaF compound, the Na$_2$S compound, or the Na$_2$Se compound is measured by the following procedures (A) to (C).

(A) Ten COMPO images (60 µm×80 µm) with a magnification of 500 times are taken using the EPMA.

(B) The taken images are converted into monochrome images using commercially available image analysis software and are subject to binarization using a single threshold value.

With this arrangement, NaF compound, Na$_2$S compound, or Na$_2$Se compound will be displayed in black.

Examples of such image analysis software include Win-Roof Ver 5.6.2 (manufactured by Mitani Shoji Co., Ltd.) or the like. Also, the term "binarization" refers to the fact that a certain "threshold value" is set to the luminance (brightness) for each pixel of an image so as to distinguish an area such that "0" is given to each pixel if the luminance is equal to or lower than a threshold value and "1" is given to each pixel if the luminance is greater than a threshold value.

(C) The maximum threshold value for not selecting the entire image is set to 100%, and the threshold value of 30 to 35% is employed to thereby select an area displayed in black.

Then, the selected area is contracted four times and expanded three times. The resulting area is intended to be particles of NaF compound, Na$_2$S compound, or Na$_2$Se compound so as to measure the size of each individual particle. An example of magnification used for area contraction and expansion is 2.3%.

On the other hand, the surface of a piece for structure observation was polished until the surface roughness (Ra) reaches 0.5 µm or less to thereby produce an observation plane. Furthermore, the observation plane was subject to etching by being immersed into an etching solution (50 ml pure water, 5 ml aqueous hydrogen peroxide, and 45 ml ammonia water) for five seconds. The structure of the etching surface was photographed by being observed by an optical microscope with a magnification of 250 times. The area of crystal grains in the field of view of 500 µm×1,000 µm was calculated by using the taken photograph in terms of the diameter of a circle equivalent to a projected area to thereby calculate the average particle diameter of particles in the field of view.

Also, quantitative analysis for the content of Ga and the content of Na in the produced target was carried out simultaneously using an ICP method (high frequency induction coupled plasma method).

Furthermore, the target film having the thickness of 1,000 nm was formed on a blue glass plate having the thickness of 3.2 mm, on which was coated with a Mo sputtering film, by means of direct-current sputtering with input power of 5 W/cm$^2$ using a magnetron sputtering device. It should be noted that the thickness of the Mo sputtering film was 500 nm.

The Ar pressure during sputtering was 1.3 Pa and the distance between the target and the substrate was 70 mm. Note that the substrate heating during film formation was not performed. Furthermore, the number of times that abnormal electrical discharge occurred during continuous sputtering for ten minutes under the aforementioned conditions was automatically recorded using an arcing counter attached to a sputtering power supply.

Such sputtering was repeated five times. Then, the surface of each target was observed for the presence/absence of cracking and chipping occurred during sputtering. The results are shown in Table 3.

TABLE 3

|  | CRACKING OR CHIPPING DURING MACHINE PROCESSING | CRACKING OR CHIPPING DURING SPUTTERING | THE NUMBER Of ABNORMAL ELECTRICAL DISCHARGE DURING SPUTTERING (TIMES/10 min CONTINUOUS DISCHARGE) |
|---|---|---|---|
| EXAMPLE 1 | NONE | NONE | 4 |
| EXAMPLE 2 | NONE | NONE | 3 |
| EXAMPLE 3 | NONE | NONE | 7 |
| EXAMPLE 4 | NONE | NONE | 9 |
| EXAMPLE 5 | NONE | NONE | 8 |
| EXAMPLE 6 | NONE | NONE | 0 |
| EXAMPLE 7 | NONE | NONE | 0 |
| EXAMPLE 8 | NONE | NONE | 5 |
| EXAMPLE 9 | NONE | NONE | 3 |
| EXAMPLE 10 | NONE | NONE | 9 |
| EXAMPLE 11 | NONE | NONE | 8 |
| EXAMPLE 12 | NONE | NONE | 7 |
| EXAMPLE 13 | NONE | NONE | 11 |
| EXAMPLE 14 | NONE | NONE | 4 |
| EXAMPLE 15 | NONE | NONE | 3 |
| EXAMPLE 16 | NONE | NONE | 32 |
| EXAMPLE 17 | NONE | NONE | 22 |
| EXAMPLE 18 | NONE | NONE | 50 |
| EXAMPLE 19 | NONE | NONE | 38 |

TABLE 3-continued

| | CRACKING OR CHIPPING DURING MACHINE PROCESSING | CRACKING OR CHIPPING DURING SPUTTERING | THE NUMBER Of ABNORMAL ELECTRICAL DISCHARGE DURING SPUTTERING (TIMES/10 min CONTINUOUS DISCHARGE) |
|---|---|---|---|
| EXAMPLE 20 | NONE | NONE | 48 |
| EXAMPLE 21 | NONE | NONE | 19 |
| EXAMPLE 22 | NONE | NONE | 4 |
| EXAMPLE 23 | NONE | NONE | 50 |
| EXAMPLE 24 | NONE | NONE | 0 |
| EXAMPLE 25 | NONE | NONE | 0 |
| EXAMPLE 26 | NONE | NONE | 0 |
| EXAMPLE 27 | NONE | NONE | 31 |
| EXAMPLE 28 | NONE | NONE | 15 |
| EXAMPLE 29 | NONE | NONE | 22 |
| EXAMPLE 30 | NONE | NONE | 0 |
| EXAMPLE 31 | NONE | NONE | 1 |
| EXAMPLE 32 | NONE | NONE | 4 |
| EXAMPLE 33 | NONE | NONE | 0 |
| EXAMPLE 34 | NONE | NONE | 1 |
| EXAMPLE 35 | NONE | NONE | 32 |

Also, the content of Na and the content of Ga were measured at five locations of each sputtered film using the electron-probe micro analyzer. The results with these average values are shown in Table 4.

The target film having the thickness of 2,000 nm was formed on a Si wafer substrate by means of direct-current sputtering under the conditions of an Ar pressure during sputtering of 1.3 Pa, a distance between target-substrate of 70 mm, and an input power of 5 W/cm² at normal temperatures using a magnetron sputtering device. The formed film was peeled off from the substrate to thereby analyze the content of oxygen contained in the film.

TABLE 4

| | VALUE MEASURED ON ELEMENTAL BASIS IN FILM | | |
|---|---|---|---|
| | Na (at %) * | Ga (at %) * | O (ppm) |
| EXAMPLE 1 | 1.3 | 14 | 240 |
| EXAMPLE 2 | 0.3 | 10 | 223 |
| EXAMPLE 3 | 0.3 | 19 | 240 |
| EXAMPLE 4 | 0.4 | 20 | 199 |
| EXAMPLE 5 | 1.8 | 6 | 486 |
| EXAMPLE 6 | 0.06 | 11 | 220 |
| EXAMPLE 7 | 0.06 | 11 | 211 |
| EXAMPLE 8 | 0.4 | 2.50 | 512 |
| EXAMPLE 9 | 0.4 | 16 | 239 |
| EXAMPLE 10 | 0.35 | 16 | 659 |
| EXAMPLE 11 | 0.5 | 15 | 827 |
| EXAMPLE 12 | 0.4 | 14 | 444 |
| EXAMPLE 13 | 0.8 | 20 | 985 |
| EXAMPLE 14 | 0.9 | 20 | 768 |
| EXAMPLE 15 | 0.05 | 9 | 421 |
| EXAMPLE 16 | 0.4 | 16 | 465 |
| EXAMPLE 17 | 0.8 | 19 | 870 |
| EXAMPLE 18 | 1.6 | 4 | 903 |
| EXAMPLE 19 | 0.3 | 13 | 679 |
| EXAMPLE 20 | 0.4 | 14 | 721 |
| EXAMPLE 21 | 0.3 | 30 | 452 |
| EXAMPLE 22 | 0.4 | 38 | 264 |
| EXAMPLE 23 | 1.3 | 21 | 220 |
| EXAMPLE 24 | 0.3 | 29 | 236 |
| EXAMPLE 25 | 0.1 | 31 | 182 |
| EXAMPLE 26 | 0.05 | 29 | 142 |
| EXAMPLE 27 | 1.4 | 30 | 354 |
| EXAMPLE 28 | 0.4 | 20 | 433 |
| EXAMPLE 29 | 0.4 | 22 | 668 |
| EXAMPLE 30 | 0.3 | 30 | 274 |
| EXAMPLE 31 | 0.1 | 31 | 439 |
| EXAMPLE 32 | 0.3 | 19 | 487 |
| EXAMPLE 33 | 0.3 | 27 | 254 |
| EXAMPLE 34 | 0.3 | 20 | 443 |
| EXAMPLE 35 | 1.4 | 29 | 894 |

* Na CONTENT IN FILM = Na/(Na + Cu + Ga) × 100%

Ga CONTENT IN FILM = Ga/(Na + Cu + Ga) × 100%

Comparative Examples

A Cu—Ga alloy powder having the component composition and the particle diameter shown in Table 5 or a Cu powder and a Na compound powder were prepared. Note that the Na compound powder was not dried in advance. These raw materials were mixed in a ball mill for a period of the specified time in a similar manner as those of Examples shown in Table 1. Mixing was performed in air. As described above, the resulting mixture was sintered by hot pressing, ordinary-pressure sintering, or hot isostatic pressing under the conditions shown in Table 6. In any of the obtained targets in Comparative Examples, the content of Na falls outside the range of from 0.05 at % to 2 at % or the content of oxygen falls outside the range of from 100 to 1,000 ppm.

In Comparative Examples 7, 15, and 16 shown in Tables 5 and 6, the mixed powder using a vacuum melting furnace was melted in a graphite crucible instead of hot pressing and then was cast into an iron mold. After cooling, the resulting target was subject to machine processing such as dry-type cutting.

TABLE 5

| | Cu—Ga(I) | | | Cu—Ga(II) | | | NaF AMOUNT ADDED (g) | Na₂S AMOUNT ADDED (g) | Na₂Se AMOUNT ADDED (g) | MIXING TIME (hour) |
|---|---|---|---|---|---|---|---|---|---|---|
| | AVERAGE PARTICLE DIAMETER (μm) | ATOMIC RATIO COMPOSITION (Ga/Ga + Cu) | AMOUNT ADDED (g) | AVERAGE PARTICLE DIAMETER (μm) | ATOMIC RATIO COMPOSITION (Ga/Ga + Cu) | AMOUNT ADDED (g) | | | | |
| COMPARATIVE EXAMPLE 1 | 250 | 0.16 | 6250 | — | | | 105.00 | — | — | 2 |
| COMPARATIVE EXAMPLE 2 | 60 | 0.10 | 6350 | — | | | 0.20 | — | — | 0 |
| COMPARATIVE EXAMPLE 3 | 5 | 0.10 | 3200 | 1 | 0.3 | 3200 | 0.10 | — | — | 4 |
| COMPARATIVE EXAMPLE 4 | 1 | 0.10 | 3200 | 1 | 0.3 | 3200 | 0.42 | — | — | 2 |
| COMPARATIVE EXAMPLE 5 | 30 | 0.05 | 6150 | — | | | 0.42 | — | — | 3 |
| COMPARATIVE EXAMPLE 6 | 0.5 | 0.10 | 6400 | — | | | 1.65 | — | — | 3 |
| COMPARATIVE EXAMPLE 7 | 200 | 0.10 | 6400 | — | | | 70.00 | — | — | 1 |
| COMPARATIVE EXAMPLE 8 | 200 | 0.15 | 6450 | — | | | — | 120.00 | — | 1 |
| COMPARATIVE EXAMPLE 9 | 100 | 0.10 | 3200 | 70 | 0.2 | 3200 | — | — | 250.00 | 2 |
| COMPARATIVE EXAMPLE 10 | 77 | 0.20 | 6400 | — | | | — | — | 1.25 | 3 |
| COMPARATIVE EXAMPLE 11 | 20 | 0.15 | 6400 | — | | | 8.40 | 39.03 | 124.94 | 1 |
| COMPARATIVE EXAMPLE 12 | 60 | 0.20 | 6287 | — | | | — | 120.00 | — | 3 |
| COMPARATIVE EXAMPLE 13 | 60 | 0.45 | 6220 | — | | | 125.00 | — | — | 3 |
| COMPARATIVE EXAMPLE 14 | 3 | 0.30 | 6540 | — | | | 0.80 | — | — | 4 |

TABLE 5-continued

| | Cu—Ga(I) | | | Cu—Ga(II) | | | NaF AMOUNT ADDED (g) | Na$_2$S AMOUNT ADDED (g) | Na$_2$Se AMOUNT ADDED (g) | MIXING TIME (hour) |
|---|---|---|---|---|---|---|---|---|---|---|
| | AVERAGE PARTICLE DIAMETER (μm) | ATOMIC RATIO COMPOSITION (Ga/Ga + Cu) | AMOUNT ADDED (g) | AVERAGE PARTICLE DIAMETER (μm) | ATOMIC RATIO COMPOSITION (Ga/Ga + Cu) | AMOUNT ADDED (g) | | | | |
| COMPARATIVE EXAMPLE 15 | 70 | 0.30 | 6450 | — | | | 63.00 | — | — | 2 |
| COMPARATIVE EXAMPLE 16 | 1 | 0.30 | 6500 | — | | | 63.00 | — | — | 2 |
| COMPARATIVE EXAMPLE 17 | 20 | 0.30 | 6350 | — | | | 63.00 | — | — | 5 |
| COMPARATIVE EXAMPLE 18 | 1 | 0.30 | 6350 | — | | | 63.00 | — | 250.00 | 5 |

TABLE 6

| | SINTERING METHOD | SINTERING CONDITION | | | SINTERED BODY COMPOSITION | | | | OXYGEN CONTENT IN SINTERED BODY (ppm) | MEAN PARTICLE DIAMETER OF Na COMPOUND IN SINTERED BODY (μm) | MEAN PARTICLE DIAMETER OF METAL PHASE IN SINTERED BODY (μm) | THE NUMBER OF NaF AGGREGATE PARTICLES WITH THE SIZE OF 10 μm OR GREATER IN THE AREA OF 0.1 mm$^2$ |
|---|---|---|---|---|---|---|---|---|---|---|---|---|
| | | TEMPERATURE (°C.) | PRESSURE (kgf/cm$^2$) | KEEP TIME (hour) | Na (at %) | Ga (at %)* | Cu (at %)* | | | | | |
| COMPARATIVE EXAMPLE 1 | HP | 750 | 400 | 1.5 | 2.3 | 16 | REMAINING | | 1098 | 8 | 210 | 6 |
| COMPARATIVE EXAMPLE 2 | ORDINARY-PRESSURE SINTERING# | 450 | 400 | 2.0 | 0.0 | 9 | REMAINING | | 890 | NOT CONFIRMED | 58 | 0 |
| COMPARATIVE EXAMPLE 3 | ORDINARY-PRESSURE SINTERING# | 800 | — | 2.0 | 0.0 | 21 | REMAINING | | 521 | NOT CONFIRMED | 24 | 0 |
| COMPARATIVE EXAMPLE 4 | HP | 600 | 400 | 2.0 | 0.01 | 19 | REMAINING | | 1210 | 1 | 5 | 0 |
| COMPARATIVE EXAMPLE 5 | HIP | 300 | 800 | 2.0 | 0.0 | 6 | REMAINING | | 251 | NOT CONFIRMED | 30 | 0 |
| COMPARATIVE EXAMPLE 6 | ORDINARY-PRESSURE SINTERING## | 960 | — | 3.0 | 0.03 | 11 | REMAINING | | 5027 | NOT CONFIRMED | 102 | 0 |
| COMPARATIVE EXAMPLE 7 | MELTING AND CASTING | 1050** | — | — | 0.0 | 11 | REMAINING | | 8 | NOT CONFIRMED | 10000 | 0 |
| COMPARATIVE EXAMPLE 8 | HIP | 500 | 1200 | 2.0 | 2.8 | 14 | REMAINING | | 1251 | 10 | 210 | 10 |
| COMPARATIVE EXAMPLE 9 | HP | 750 | 200 | 1.0 | 3.8 | 16 | REMAINING | | 1694 | 12 | 145 | 8 |
| COMPARATIVE EXAMPLE 10 | HP | 650 | 350 | 2.0 | 0.01 | 21 | REMAINING | | 1249 | NOT CONFIRMED | 59 | 0 |
| COMPARATIVE | | 700 | 350 | 2.0 | 3.2 | 14 | REMAINING | | 1413 | 6 | 40 | 2 |

TABLE 6-continued

| | SINTERING METHOD | SINTERING CONDITION | | | SINTERED BODY COMPOSITION | | | | OXYGEN CONTENT IN SINTERED BODY (ppm) | MEAN PARTICLE DIAMETER OF Na COMPOUND IN SINTERED BODY (μm) | MEAN PARTICLE DIAMETER OF METAL PHASE IN SINTERED BODY (μm) | THE NUMBER OF NaF AGGREGATE PARTICLES WITH THE SIZE OF 10 μm OR GREATER IN THE AREA OF 0.1 mm² |
|---|---|---|---|---|---|---|---|---|---|---|---|---|
| | | TEMPERATURE (° C.) | PRESSURE (kgf/cm²) | KEEP TIME (hour) | Na (at %) | Ga (at %)* | Cu (at %)* | | | | | |
| EXAMPLE 11 COMPARATIVE EXAMPLE 12 | | 950 | 100 | 1.5 | 3.0 | 21 | REMAINING | | 1187 | 3 | 54 | 1 |
| COMPARATIVE EXAMPLE 12 | | 700 | 150 | 2.0 | 3.0 | 40 | REMAINING | | 1005 | 4 | 71 | 0 |
| COMPARATIVE EXAMPLE 13 | | 700 | 300 | 3.0 | 0.02 | 31 | REMAINING | | 837 | NOT CONFIRMED | 15 | 0 |
| COMPARATIVE EXAMPLE 14 | MELTING AND CASTING METHOD | 1150** | — | 0.3 | 0.02 | 19 | REMAINING | | 4 | NOT CONFIRMED | 12000 | 0 |
| COMPARATIVE EXAMPLE 15 | | 1250** | — | 0.5 | 0.0 | 31 | REMAINING | | 8 | NOT CONFIRMED | 8000 | 0 |
| COMPARATIVE EXAMPLE 16 | ORDINARY-PRESSURE SINTERING## | 800 | — | 2.0 | 1.5 | 29 | REMAINING | | 7437 | 2 | 42 | 1 |
| COMPARATIVE EXAMPLE 17 | HIP | 400 | 1000 | 2.0 | 1.5 | 29 | REMAINING | | 1248 | 1 | 3 | 2 |

96% N2, 4% H2 ATMOSPHERE
SINTERING IN AIR
*Na CONTENT IN SINTERED BODY = Na/(Na + Cu + Ga) × 100
Ga CONTENT IN SINTERED BODY = Ga/(Na + Cu + Ga) × 100
**KEEP TEMPERATURE OF MOLTEN METAL UPON DISSOLUTION

The evaluation of Comparative Examples was performed in a similar manner as that of Examples. The evaluation results are shown in Tables 7 and 8.

TABLE 7

|  | CRACKING OR CHIPPING DURING MACHINE PROCESSING | CRACKING OR CHIPPING DURING SPUTTERING | THE NUMBER OF ABNORMAL DISCHARGE DURING SPUTTERING (TIMES/10 min CONTINUOUS DISCHARGE) |
|---|---|---|---|
| COMPARATIVE EXAMPLE 1 | CHIPPING | NONE | 500 |
| COMPARATIVE EXAMPLE 2 | CHIPPING | CRACKING | 1396 |
| COMPARATIVE EXAMPLE 3 | NONE | NONE | 0 |
| COMPARATIVE EXAMPLE 4 | NONE | NONE | 0 |
| COMPARATIVE EXAMPLE 5 | CRACKING | — | — |
| COMPARATIVE EXAMPLE 6 | COLOR VARIATION IN PROCESSED SURFACE OF SINTERED BODY. EVALUATION INTERRUPTED | — | — |
| COMPARATIVE EXAMPLE 7 | NONE | NONE | 0 |
| COMPARATIVE EXAMPLE 8 | CRACKING | — | — |
| COMPARATIVE EXAMPLE 9 | CRACKING | — | — |
| COMPARATIVE EXAMPLE 10 | NONE | NONE | 0 |
| COMPARATIVE EXAMPLE 11 | NONE | CRACKING | 3992 |
| COMPARATIVE EXAMPLE 12 | NONE | CHIPPING | 100 |
| COMPARATIVE EXAMPLE 13 | NONE | CRACKING | 6003 |
| COMPARATIVE EXAMPLE 14 | NONE | NONE | 5 |
| COMPARATIVE EXAMPLE 15 | NONE | NONE | 0 |
| COMPARATIVE EXAMPLE 16 | CRACKING | — | — |
| COMPARATIVE EXAMPLE 17 | NONE | CRACKING | 8901 |
| COMPARATIVE EXAMPLE 18 | NONE | CHIPPING | 3992 |

TABLE 8

|  | VALUE MEASURED ON ELEMENTAL BASIS IN FILM | | |
|---|---|---|---|
|  | Na (at %) * | Ga (at %) * | O (ppm) |
| COMPARATIVE EXAMPLE 1 | 2.4 | 14.0 | 1100 |
| COMPARATIVE EXAMPLE 2 | 0.0 | 9 | 870 |
| COMPARATIVE EXAMPLE 3 | 0.0 | 20 | 451 |
| COMPARATIVE EXAMPLE 4 | 0.0 | 20 | 1171 |
| COMPARATIVE EXAMPLE 5 | — | — | — |
| COMPARATIVE EXAMPLE 6 | — | — | — |
| COMPARATIVE EXAMPLE 7 | 0.0 | 11 | 30 |
| COMPARATIVE EXAMPLE 8 | — | — | — |
| COMPARATIVE EXAMPLE 9 | — | — | — |
| COMPARATIVE EXAMPLE 10 | 0.0 | 19 | 1265 |
| COMPARATIVE EXAMPLE 11 | 3.0 | 14 | 1870 |
| COMPARATIVE EXAMPLE 12 | 2.9 | 22 | 1208 |
| COMPARATIVE EXAMPLE 13 | — | — | — |
| COMPARATIVE EXAMPLE 14 | 0 | 30 | 927 |
| COMPARATIVE EXAMPLE 15 | 0 | 20 | 98 |
| COMPARATIVE EXAMPLE 16 | — | — | — |
| COMPARATIVE EXAMPLE 17 | — | — | — |
| COMPARATIVE EXAMPLE 18 | — | — | — |

* Na CONTENT IN FILM = Na/(Na + Cu + Ga) × 100%
* Ga CONTENT IN FILM = Ga/(Na + Cu + Ga) × 100%

As can be seen from the evaluation results, in all of the Examples, cracking and chipping during machine processing and cracking and chipping during sputtering did not occur as shown in Table 3. As shown in Table 7, cracking or chipping occurred during machine processing in Comparative Examples 1, 2, 5, 8, 9, and 16. Also, cracking or chipping during sputtering occurred in Comparative Examples 2, 11, 12, 13, 17, and 18.

In Comparative Examples 1, 8, 9, 11, 12, and 13 in which the content of Na was as high as 2.3 at % or greater and the number of aggregates in the NaF compound, the $Na_2S$ compound, or the $Na_2Se$ compound was many, chipping occurred in the target during machine processing or during sputtering. In Comparative Examples 1, 7, 8, 9, 15, and 16 in which the particle diameter of the metal phase was large, chipping or cracking occurred in the target even during processing.

In Comparative Examples 7, 15, and 16 produced by the melting/casting method, the Na compound added to the starting material evaporated during melting/casting, resulting in a significant reduction in the content of Na in the target. In Comparative Example 12 in which aggregation of the Na compound was reduced but the content of Na was as high as 3.0 at %, Comparative Example 2 in which no content of Na was detected because of 0.0 at % of the content of Na and the hot pressing temperature was as low as 450° C., and Comparative Example 5 in which no content of Na was detected because of 0.0 at % of the content of Na and the HIP temperature was as low as 300° C., cracking or chipping occurred during processing or during sputtering.

In Comparative Examples 1, 2, 4, 8, 9, 10, 11, 12, 13, and 18, the starting material powder was mixed in air and the Cu starting material powder or the Cu—Ga starting material powder was oxidized, the oxygen concentration in the target produced by hot pressing or HIP was higher than the target consisting of the mixed powder in which the similar starting material powder was mixed in an inert gas. On the other hand, in Comparative Examples 7, 15, and 16 produced by the casting method, oxygen contained in the target was removed during vacuum melting, so that the content of oxygen in the obtained target was low. In Comparative Example 3 in which sintering was performed in a hydrogen-containing atmosphere, the oxygen concentration in the target was reduced by hydrogen reduction during sintering.

In Comparative Example 6 in which the ordinary-pressure sintering temperature in air was as high as 960° C. and the content of Na in the target was extremely as low as 0.03 at %, it was confirmed that a partial surface of the target was melted by the atmospheric sintering and the entire surface was further oxidized, resulting in occurrence of color variations. Thus, no evaluation was conducted. In Comparative Examples in which the content of Na was as low as 0.05 at % or less, almost no sodium was contained in the obtained film, and thus, the object of the present invention could not be achieved.

In Comparative Examples 1, 2, 11, 12, 13, 14, 17, and 18, the number of times that abnormal electrical discharge occurred during sputtering was 100 times or greater. In all of the Examples of the present invention, the number of times that abnormal electrical discharge occurred during sputtering was 50 times or less.

As described above, since the sputtering target of the present invention has a component composition that contains 1 to 40 at % of Ga, 0.05 to 2 at % of Na as metal element components other than F, S and Se, and the balance composed of Cu and unavoidable impurities, wherein the sputtering target contains Na in at least one form selected from among sodium fluoride, sodium sulfide, and sodium selenide and the content of oxygen is from 100 to 1,000 ppm, a Cu—Ga film favorably containing Na which is effective for the improvement in power generation efficiency may be formed using the sputtering method.

Thus, the sputtering target of the present invention can be employed so as to produce a solar cell exhibiting high power generation efficiency using the sputtering method because the required amount of Na may favorably be added to a light absorbing layer.

The technical scope of the present invention is not limited to the aforementioned embodiments and Examples, but the present invention may be modified in various ways without departing from the scope or teaching of the present invention.

What is claimed is:

1. A sputtering target having a component composition that contains 1 to 40 at % of Ga, 0.05 to 2 at % of Na as metal element components, and the balance composed of Cu and unavoidable impurities, wherein the sputtering target contains Na in at least one form selected from among sodium fluoride, sodium sulfide, and sodium selenide and the content of oxygen is from 100 to 1,000 ppm.

2. The sputtering target according to claim 1, wherein the sputtering target has a structure in which at least one selected from among a NaF compound phase, a $Na_2S$ compound phase, and a $Na_2Se$ compound phase is dispersed in a target material and the average particle diameter of the NaF compound phase, the $Na_2S$ compound phase, and the $Na_2Se$ compound phase is 5 μm or less.

3. The sputtering target according to claim 1, wherein the average crystal particle size of a metal phase in the target material after sintering is from 10 to 100 μm.

4. A method for producing the sputtering target according to claim 1, the method comprising:
drying at least one selected from among a NaF compound powder, a $Na_2S$ compound powder, and a $Na_2Se$ compound powder at a temperature of 120° C. or higher; and
sintering a formed product consisting of a mixed powder of at least one selected from among the dried NaF compound powder, the dried $Na_2S$ compound powder, and the dried $Na_2Se$ compound powder, and a Cu—Ga alloy powder, or a formed product consisting of a mixed powder of at least one selected from among the dried NaF compound powder, the dried $Na_2S$ compound powder, and the dried $Na_2Se$ compound powder, a Cu—Ga alloy powder, and a Cu powder in a vacuum, in an inert gas atmosphere, or in a reducing atmosphere.

5. A method for producing the sputtering target according to claim 1, the method comprising:
drying at least one selected from among a NaF compound powder, a $Na_2S$ compound powder, and a $Na_2Se$ compound powder at a temperature of 120° C. or higher; and
hot pressing a mixed powder of at least one selected from among the dried NaF compound powder, the dried $Na_2S$ compound powder, the dried $Na_2Se$ compound powder, and a Cu—Ga alloy powder, or a mixed powder of at least one selected from among the dried NaF compound powder, the dried $Na_2S$ compound powder, and the dried $Na_2Se$ compound powder, a Cu—Ga alloy powder, and a Cu powder in a vacuum or an inert gas atmosphere.

6. A method for producing the sputtering target according to claim 1, the method comprising:

drying at least one selected from among a NaF compound powder, a Na$_2$S compound powder, and a Na$_2$Se compound powder at a temperature of 120° C. or higher; and sintering a mixed powder of at least one selected from among the dried NaF compound powder, the dried Na$_2$S compound powder, the dried Na$_2$Se compound powder, and a Cu—Ga alloy powder, or a mixed powder of at least one selected from among the dried NaF compound powder, the dried Na$_2$S compound powder, and the dried Na$_2$Se compound powder, a Cu—Ga alloy powder, and a Cu powder by hot isostatic pressing.

7. The method for producing a sputtering target according to claim 4, wherein the formed product is sintered at a temperature of 700 to 950° C.

8. The method for producing a sputtering target according to claim 5, wherein the hot pressing is performed at a temperature of 500 to 900° C.

9. The method for producing a sputtering target according to claim 6, wherein the hot isostatic pressing is performed at a temperature of 500 to 900° C.

* * * * *